US006525987B2

(12) United States Patent
Hilbert

(10) Patent No.: US 6,525,987 B2
(45) Date of Patent: Feb. 25, 2003

(54) DYNAMICALLY CONFIGURED STORAGE ARRAY UTILIZING A SPLIT-DECODER

(75) Inventor: Mark Francis Hilbert, Naperville, IL (US)

(73) Assignee: Tachyon Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/864,493

(22) Filed: May 23, 2001

(65) Prior Publication Data
US 2002/0176310 A1 Nov. 28, 2002

(51) Int. Cl.[7] .................................................. G11C 8/00
(52) U.S. Cl. .............. 365/230.06; 365/200; 365/230.02
(58) Field of Search ................................ 365/200, 201, 365/230.01, 230.02, 230.06, 231, 189.07, 195

(56) References Cited

U.S. PATENT DOCUMENTS 5,771,195 A  *  6/1998  McClure ..................... 365/200
6,144,593 A  *  11/2000 Cowles et al. ......... 365/189.02
6,236,602 B1 *  5/2001  Patti ............................ 365/200
6,269,035 B1 *  7/2001  Cowles et al. ......... 365/189.02

* cited by examiner

Primary Examiner—David Nelms
Assistant Examiner—Thong Le
(74) Attorney, Agent, or Firm—Calvin B. Ward

(57) ABSTRACT

A memory having a two-dimensional array of memory cells organized as a plurality of rows and columns. The memory includes spare rows and columns. A controller in the memory tests the memory at power up and determines if any of the rows or columns are defective. A defective row or column is re-mapped to one of the spare rows or columns, respectively. Data specifying the re-mapping is stored in a separate re-mapping address decode circuit. When an address specifying a memory cell is received by the memory, a conventional address decode circuit decodes the address at the same time the re-mapping decoder searches for a match to the address. If the re-mapping decoder finds the address, it inhibits the conventional decoder and supplies the appropriate column or row select signals. The re-mapping decoder is preferably constructed from a content-addressable memory.

6 Claims, 4 Drawing Sheets

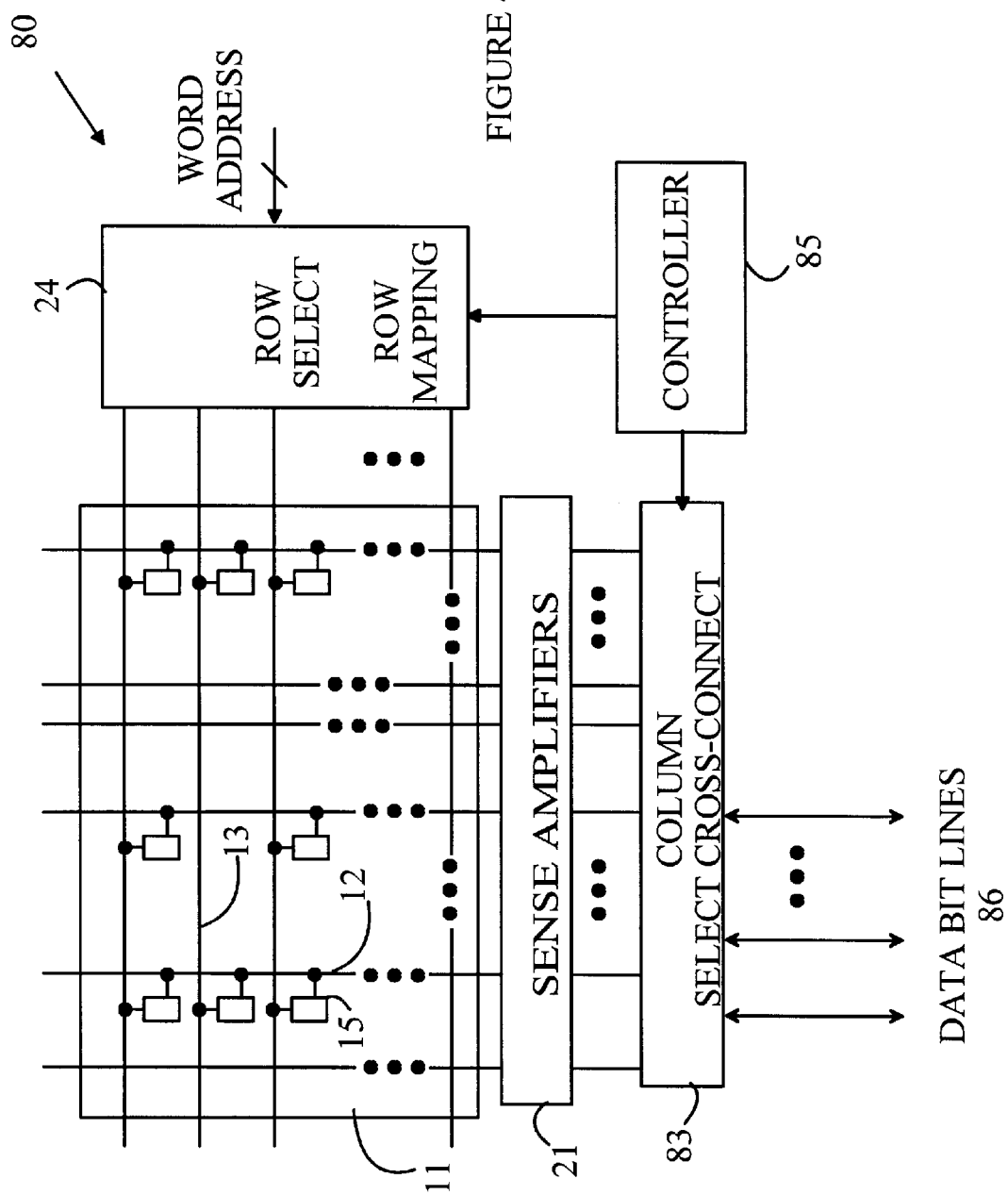

DYNAMICALLY CONFIGURED STORAGE ARRAY UTILIZING A SPLIT-DECODER

FIELD OF THE INVENTION

The present invention relates to memory systems, and more particularly, to a memory system, which detects errors and reconfigures itself to avoid bad memory cells.

BACKGROUND OF THE INVENTION

As the cost of computational hardware has decreased, computers with ever-larger memory systems have proliferated. Systems with hundreds of Mbytes are common, and systems with a few Gbytes of memory are commercially available. As the size of the memory increases, problems arising from bad memory cells become more common.

Memory failures may be divided into two categories, those resulting from bad memory cells that are detected at the time of manufacture and those that arise from cells that fail during the operation of the memory. At present, problems arising from defective memory cells that are detected during the manufacturing process are cured by replacing the bad cells. The typical memory array is divided into blocks. Each memory chip has a predetermined number of spare blocks fabricated thereon. If a block in the memory is found to have a defective memory cell, the block in question is disconnected from the appropriate bus and one of the spares is connected to the bus in its place. However, once the part is packaged, there are no means available for replacing a block with a spare, since the replacement process requires hard wiring of the spares to the bus.

The cost of testing the memory chips is a significant factor in the cost of the chips. The rate at which memory cells can be tested is limited by the internal organization of the memory blocks and the speed of the buses that connect the memory blocks to the test equipment. The various buses are limited to speeds of a few hundred MHz. Data is typically written and read as blocks having 64 bits or less. Since a write operation followed by a read operation requires several clock cycles, the rate at which memory can be tested is limited to 100 million tests per second. Extensive testing requires each memory cell to be accessed a large number of times under different conditions such as temperature and clock speed. Hence, a 1 Gbyte memory chip would require minutes, if not hours, to thoroughly test. The cost of such testing would be prohibitive; hence, prior art memory chip designs will not permit extensive testing at the 1 Gbyte level and beyond.

In principle, all of these types of memories would benefit by having some form of reconfiguration system built directly into the memory. Such a system is described in U.S. Pat. No. 6,236,602 which is hereby incorporated by reference. In this type of system the memory is constructed with blocks of memory cells that include spare cells. The memory cells have physical addresses that relate to the location of the memory cells in the physical memory blocks that make up the memory. The memory stores and retrieves data with respect to logical addresses that are utilized by processors connected to the memory to specify data stored, or to be stored, in the memory. The correspondence between the logical and physical address is held in a mapping processor that is under the control of a controller in the memory. When bad memory cells are detected by the controller, the mapping is altered by mapping the corresponding bad cell logical address to the spare memory cells contained in the memory.

While the memory scheme taught in the above-identified patent substantially improves many aspects of memory performance and memory yields, the mapping processors increase the cost of the memory chips. In the scheme described in the above-identified patent, the memory is constructed from blocks of memory cells organized as a plurality of rows and columns. The memory processors are implemented using content-addressable memories (CAMs) that store the logical addresses corresponding to each row in the memory. These CAMs can be a significant fraction of the memory area, and hence, it would be advantageous to provide a memory mapping scheme that requires less chip area.

Broadly, it is the object of the present invention to provide an improved reconfigurable memory system.

These and other objects of the present invention will become apparent to those skilled in the art from the following detailed description of the preferred embodiments of the invention and the accompanying drawings.

SUMMARY OF THE INVENTION

The present invention is a memory for storing and retrieving data values, each data value being associated with a row address. The memory includes an array of memory storage cells organized as R rows and C columns, each storage cell being connected to one of C bit lines and one of R row lines. Each memory storage cell stores a data value and includes circuitry for coupling that data value to the bit line to which that memory cell is connected in response to a row control signal on the row line to which that memory cell is connected. The memory includes a row select circuit for generating the row control signal on one of the row lines in response to one of the row addresses being coupled to the row select circuit. The row select circuit includes a memory for storing a mapping of the row addresses to the row lines, the mapping determining which of the row lines is selected for each possible value of the row address. The R row lines are divided into $N_r$ normal row lines and $N_{rs}$ spare row lines. The row select circuit includes first and second decoding circuits. The first decoding circuit generates one of the row select signals on one of the $N_r$ normal row lines in response to the row address being coupled thereto. In addition, the first decoding circuit includes an inhibit circuit for preventing that row select signal from being applied to that normal row line. The second decoding circuit stores $N_{rs}$ entries, each entry having a space for storing a first value specifying one of the row addresses and a second value specifying one of the $N_{rs}$ spare row lines. The second decoding circuit determines if one of the entries includes a first value that matches the row address and causes the inhibit circuit in the first decoding circuit to prevent the application of the row select signal. The second decoding circuit then generates one of the row select signals on the spare row line specified by the second value in that entry.

In one embodiment of the invention, the memory also includes a column select circuit for selecting a data value on one of the bit lines and applying that data value to an output line in response to a column address being coupled to the column select circuit. In this embodiment, the C bit lines are divided into $N_c$ normal bit lines and $N_{cs}$ spare bit lines, $N_c$ and $N_{cs}$ being greater than 0. The column select circuit includes a column multiplexer, and third and fourth decoding circuits. The column multiplexer connects one of the bit lines to the output line in response to a column select signal on one of the C column select lines, the column select line receiving that signal determining which of the bit lines is connected to the output line. $N_c$ of the column select lines correspond to the normal bit lines and $N_{cs}$ of the column select lines correspond to the spare bit lines. The third decoding circuit generates one of the column select signals on one of the $N_c$ normal column select lines in response to the column address being coupled thereto, and includes an inhibit circuit for preventing that column select signal from being applied to that normal column select line. The fourth decoding circuit stores $N_{cs}$ entries, each entry having space for storing a first value specifying one of the column addresses and a second value specifying one of the $N_{cs}$ spare bit lines. The fourth decoding circuit determines if one of the entries includes a first value that matches the column address and causes the inhibit circuit in the third decoding circuit to prevent the application of the column select signal. The fourth decoding circuit also generates one of the column select signals on the spare column select line corresponding to the spare bit line specified by the second value in that entry if such a match is found.

The memory may also include a controller for testing the memory cells and for storing the first and second values in the second and fourth decoding circuits. The controller preferably tests the memory cells when power is first applied to the memory.

BRIEF DESCRIPTION OF THE DRAWINGS

FIG. 4 is a block diagram of a memory block 80 according to the present invention in which data words occupy all of the storage cells on a given row.

DETAILED DESCRIPTION OF THE PREFERRED EMBODIMENTS OF THE PRESENT INVENTION

The manner in which the present invention gains its advantages can be more easily understood with reference to a memory for storing and retrieving N-bit data words. In the following discussion, the $i^{th}$ bit of the $j^{th}$ word stored in the memory will be denoted by $^jW_i$. To simplify the following discussion, it will be assumed that the memory is divided into blocks of memory cells in which each block is organized as a plurality of rows and columns of memory cells. Further, it will be assumed that each block of memory cells stores data for one particular bit position of the data words assigned to that block. In this case, a data word is read by reading one bit from each of N data blocks. The specific bit is determined by the address of the data word, i.e., the value of j defined above. The value of i and the value of the most significant bits of the address determine the block. The remaining bits in the address may be viewed as defining a row address and a column address, the memory cell in question being located at the intersection of the defined row and column.

Figure 1:
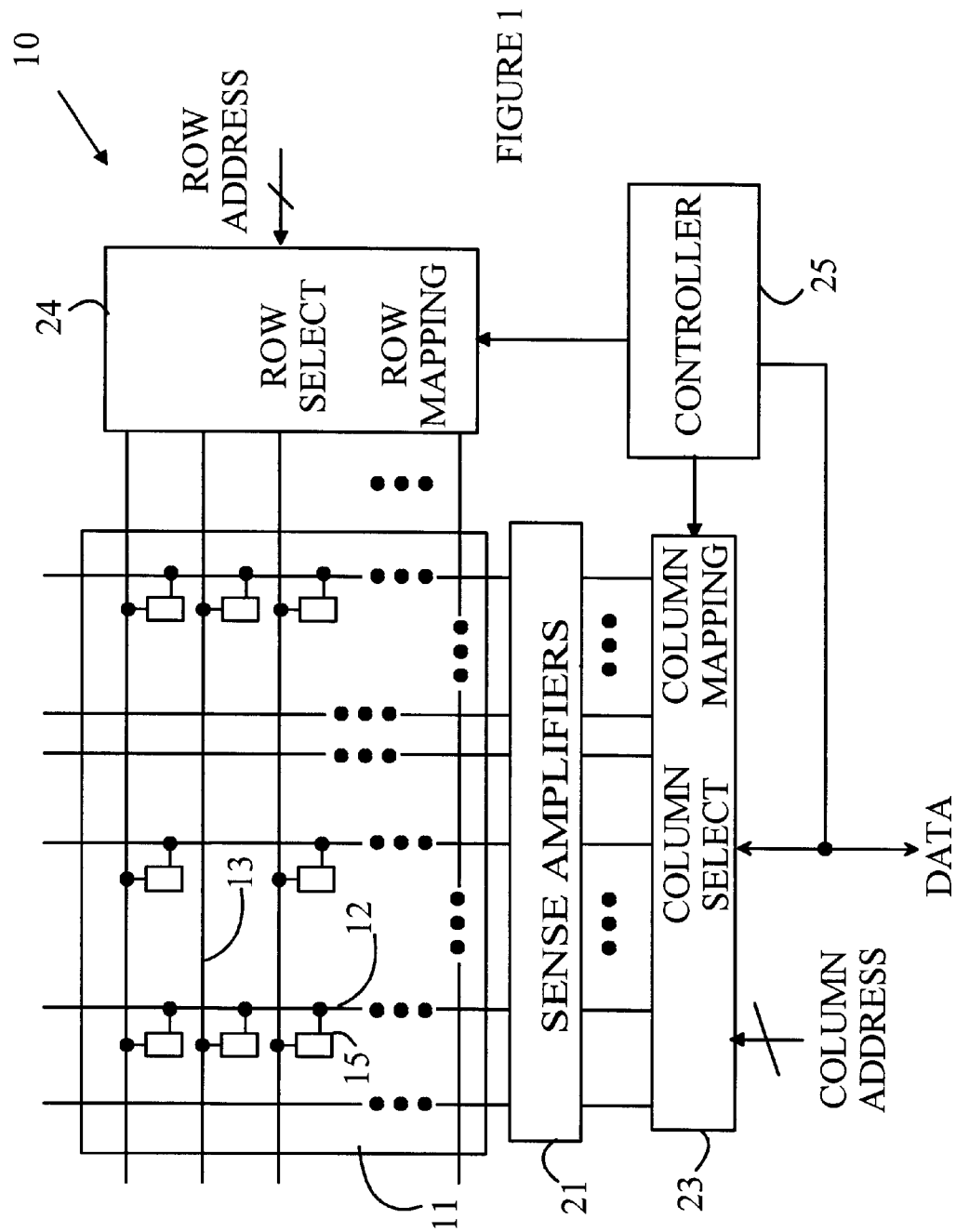
FIG. 1 is a block diagram of a memory block 10 according to the present invention.

Refer now to FIG. 1, which is a block diagram of a memory block 10 according to the present invention. Memory block 10 includes an array of data storage cells 11 organized as a plurality of rows and columns. A typical storage cell is shown at 15. A storage cell is selected for reading or writing by placing a signal on the row line connected to that storage cell. A typical row line is shown at 13. All of the storage cells on a given row line are selected together. When selected, each storage cell on the selected row line places a signal indicative of the data stored therein on the bit line connected to that storage cell. A typical bit line is shown at 12. The specific row selected is determined by the row portion of the address communicated to the memory by the device seeking to read data and by a row mapping that is stored in row select circuit 24.

All of the data values on the selected row line are read in parallel. A block of sense amplifiers 21 reads the signals on the bit lines and latches their values. A column select circuit 23 is used to select the value from one of the bit lines for output. The specific bit line selected is determined by the column portion of the address and by a column mapping that is stored in the column select circuit 23.

For the purposes of this discussion, it will be assumed that the storage cells are of the DRAM type. A new data bit is written into memory block 10 by providing the address at which the data is to be stored. The row containing this address is read out, and the data values currently in that row are refreshed by the sense amplifiers. The new data bit value is written into the bit line selected by the column address, overriding the value in the sense amplifier. The entire row of storage cells is then re-written from the register in the sense amplifier block.

In the present invention, each memory block includes more rows and columns than are needed to store the number of bits corresponding to the address range assigned to the memory block. The additional rows and columns are used as spares to replace rows or columns that are found to defective. In addition to storing and retrieving data words for processors connected to the memory, the memory includes a self-test function that is executed by controller 25 at power up. When a defective row or column is detected, the storage functions of that row or column are moved to one of the spare rows or columns, and the mapping in the corresponding row or column select circuit is altered to reflect the new location for the data corresponding to the addresses in question.

The memory block can be viewed as having absolute addresses for the rows and columns that are mapped to the row and column addresses determined by the data word's address and the particular bit in that data word that is stored in the memory block. In the memory system described in U.S. Pat. No. 6,236,602, the row mapping function was performed with the aid of a CAM that had one entry for each row in the memory block. Each entry required at least $\log_2 N_r$ bits, where $N_r$ is the number of rows. Consider a memory block having 128×128 storage cells. The row CAM adds at least 7 bits of static memory per row. Since the static memory requires substantially more area than a DRAM cell, these 7 additional bits represent a substantial fraction of the chip area. In addition, the output of the CAM must be decoded to generate the 1 of $N_r$ signal pattern that selects the row corresponding to a given row address. This decode circuit and the corresponding decode time present additional problems, as the decode operation must be performed in series with the table lookup, and hence, adds to the memory cycle time.

The present invention substantially reduces the additional space needed for the mapping functions. In addition, the present invention reduces the column and row decoding times. For the purposes of this discussion, denote the number of bits that the memory block is designed to store by $N_t$. This is the number of bits that can normally be addressed by a device external to the memory containing the memory block in question. The number of rows in the memory block will be denoted by $R=N_r+Nrs$, where $N_{rs}$ is the number of spare rows in the block. Similarly, the number of columns will be denoted by $C=N_c+N_{cs}$, where $N_{cs}$ is the number of spare columns in the block, and $N_r=N_rN_c$.

Figure 2:
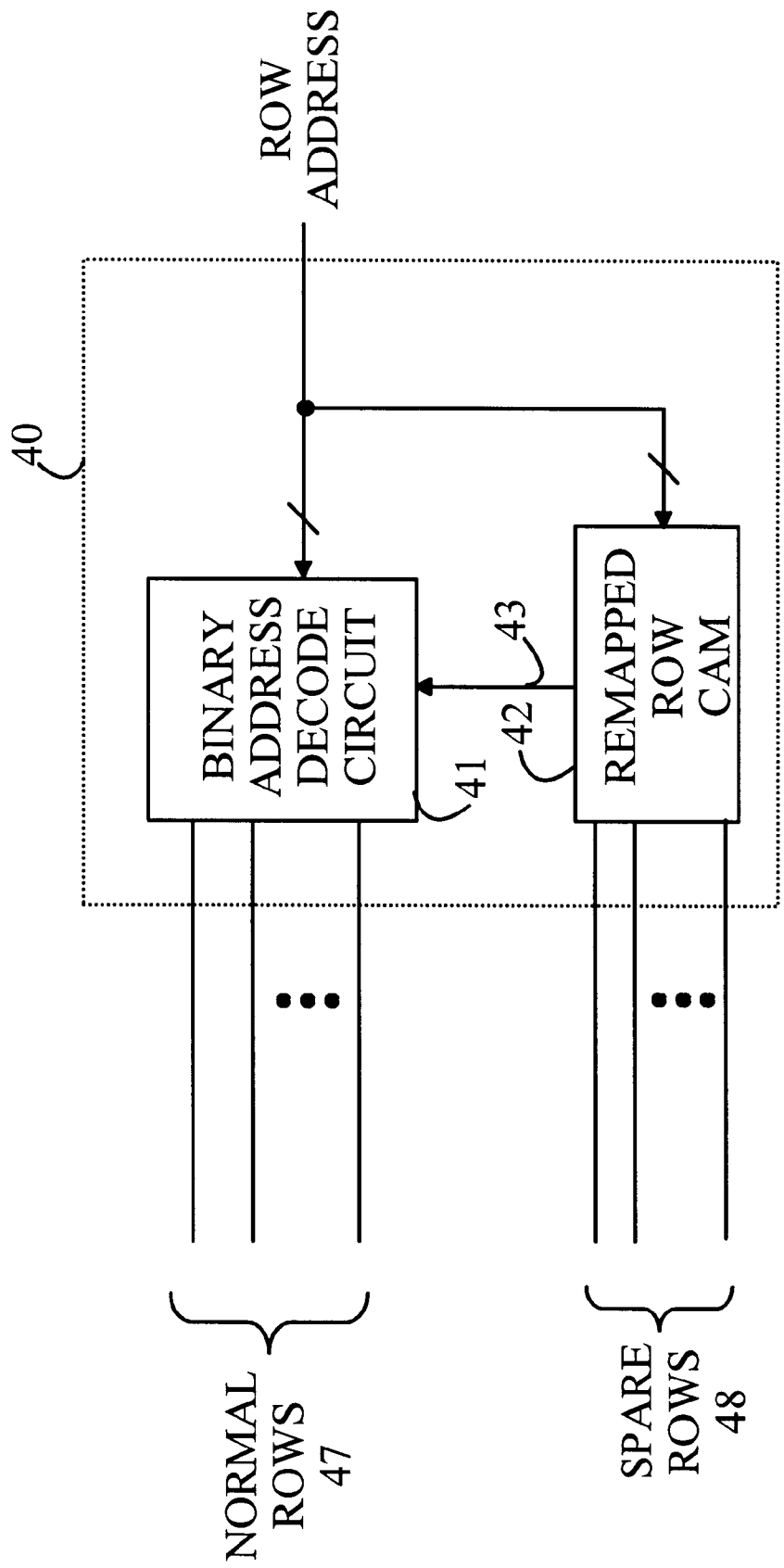
FIG. 2 is a block diagram of a row select circuit 40 according to the present invention.

The manner in which the row select circuit operates will now be discussed with reference to FIG. 2, which is a block diagram of a row select circuit 40 according to the present invention. Row select circuit 40 generates a signal in one of the R row lines in response to a row address being coupled thereto. The R rows are divided into $N_r$ "normal rows" and $N_{rs}$ "spare rows" as shown at 47 and 48 respectively. Row select circuit 40 includes a conventional address decoder 41 which operates on the address bits to generate a signal on one of the $N_r$ normal rows. This circuitry is essentially the same as that used in a conventional row-decoding scheme.

Row select circuit 40 also includes a small CAM 42, which is used to store the identity of any rows that have been re-mapped to the spare rows. When an address is received by row select circuit 40, CAM 42 searches its memory in parallel with the decoding operations being performed by decoder 41. If CAM 42 finds an entry for the row address in question, CAM 42 places a signal on line 43, which inhibits decoder 41 from placing a signal on any of the normal row lines. CAM 42 then outputs a decoded signal to the corresponding spare row line.

CAM 42 requires one entry for each spare row line. Each entry has two fields, one for storing the row address of a row that has been re-mapped and one for storing the identity of the spare row to which that row address has been re-mapped. If the second entry is in the form of a binary coded address, $\log_2 N_{rs}$ bits are required. The first entry requires $\log_2 N_r$ bits. Hence, if there are 4 spare rows for a memory having 128 rows, CAM 42 requires only 4 entries having 7 bits in the address field and 2 bits in the data field indicating the identity of the spare row line corresponding to the address in the address field, i.e., 36 bits of static memory storage. In contrast, a row select circuit using a table to perform all of the decoding would require a minimum of 924 static memory bits. This example assumes that the CAM stores the binary coded address of the spare row being used as the replacement.

Alternatively, the second entry in the CAM table can be in the form of a fully decoded spare row address thereby removing the need for a separate binary decoder for the re-mapped address. In this case, the second entry will be $N_{rs}$ bits long with only one of the bits set to a one. The value stored in the second field can be applied directly to the spare row select lines to generate the corresponding row enable signal.

It should be noted that the time needed for the CAM to search its memory for a remapped row and communicate that result to decode circuit 41 is less than the time needed to fully decode the 7-bits in the above example. Hence, the present invention does not increase the decode time beyond that present in a conventional memory block.

Figure 3:
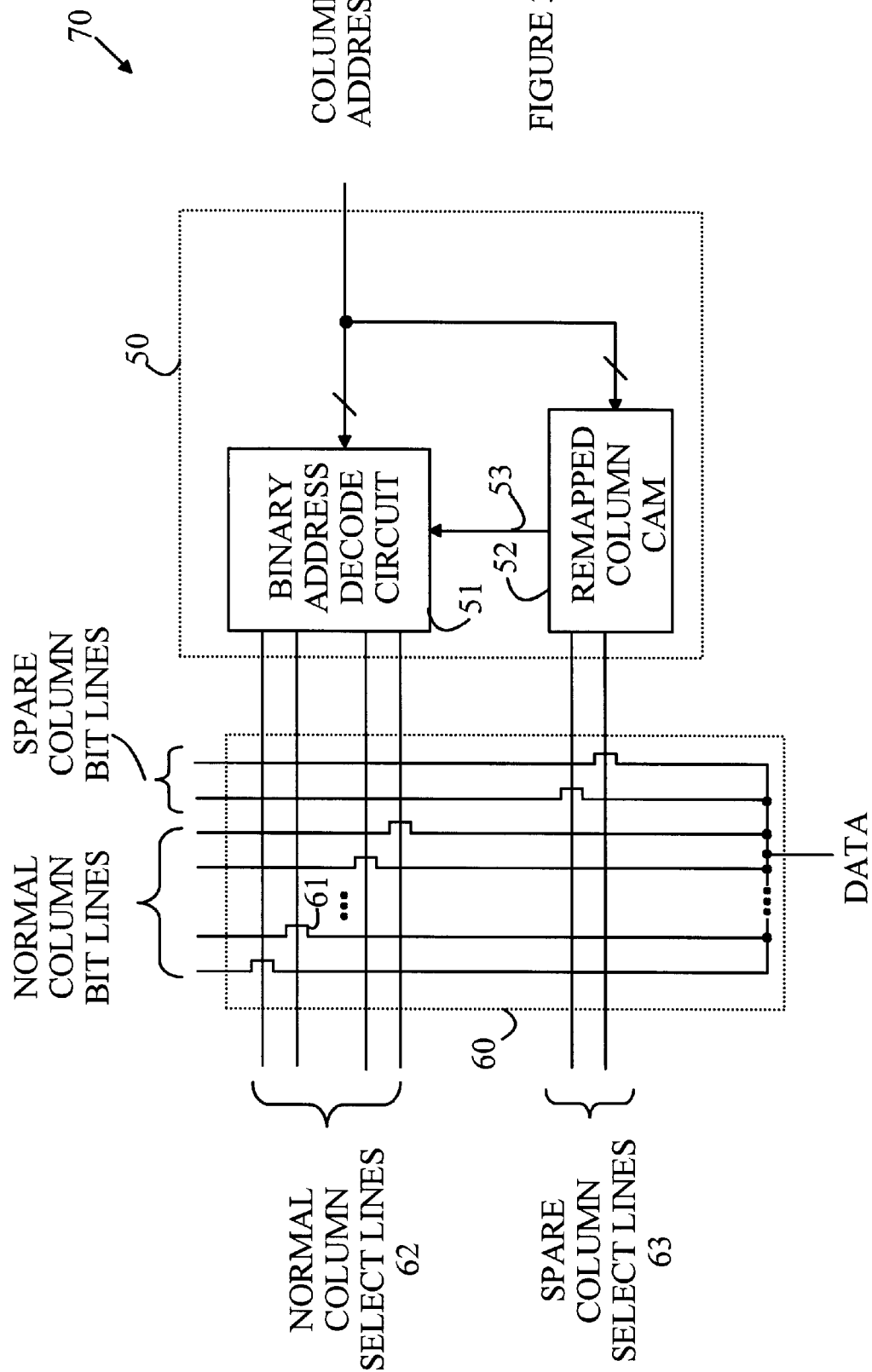
FIG. 3 is a block diagram of a column select circuit 70 according to the present invention.

In general, the column select circuit operates in an analogous manner. Refer now to FIG. 3, which is a block diagram of a column select circuit 70 according to the present invention. Column select circuit 70 is constructed from a bi-directional multiplexer 60 and a column address decode circuit 50. Multiplexer 60 includes one gate transistor 61 for each bit line. The gate transistor that is conducting at any given time is determined by a signal placed on one of select lines. The select lines corresponding to the normal and spare columns are shown at 62 and 63, respectively. These select lines are operated in a manner similar to the row select lines discussed above. The column address is input to column address decode circuit 50, which includes a binary address decode circuit 51 for selecting one of the $N_c$ normal column select lines and a CAM 52 which stores the information specifying any normal columns that have been remapped to the spare columns. If CAM 52 stores a re-mapping for the column address in question, it places a signal on line 53 which inhibits address decode circuit 51. Once again, the second field in the table stored in CAM 52 can be in the form of a binary coded address for the spare column or a fully decoded one of $N_{cs}$ addresses. If a binary coded address is utilized, then a second binary decoder is required to convert the binary coded address to a signal on one of the $N_{cs}$ spare column select lines.

While the above-described embodiments of the present invention have utilized CAMs to store the mapping between the spares and the memory addresses, other forms of memory may also be utilized. In principle, any memory that can be searched in a sufficiently short period of time can be used.

The above-described embodiments of the present invention utilize a memory architecture in which each of the memory blocks store bits from a single bit position in the data words. This arrangement allows the selection of the column corresponding to any particular column address to be carried out using a multiplexer, since only one column will be selected and the precise position of the column in the memory block does not depend on the address of the data word being processed. However, the present invention can be practiced with other memory architectures. In almost all memory architectures, multiple bits are selected by activating a corresponding row select line. Such memory blocks can be augmented with spare rows that are used to re-map data that would have been stored in a row that has been found to be defective. The teachings of the present invention may be utilized to construct the re-mapping hardware in such a memory. For example, memories in which each block stores a plurality of data words, each data word occupying one row or a part thereof are well known in the memory arts. In such memories, the row address is determined by the data word address; however, the data from multiple columns is read-out simultaneously to provide the data word. It will be apparent from the preceding discussion that the row re-mapping scheme of the present invention may also be utilized with such architectures.

Refer now to FIG. 4, which is a block diagram of a memory block 80 according to the present invention in which data words occupy all of the storage cells on a given row. To simplify the following discussion, those elements of memory block 80 that serve functions similar to those of memory block 10 discussed above have been given the same numeric designations. To further simplify the discussion, it will be assumed that each row of memory block 80 corresponds to one data word whose bits are read and written together. In this case, the number of data bits is equal to $N_c$ and there are $N_{sc}$ spare columns in the data block, given a total of $C=N_c+N_{sc}$ columns. It will be assumed that the memory block also includes spare rows that are used to re-map defective rows in the manner described above with reference to FIGS. 1 and 2.

When a column is determined to be defective, a spare can be utilized provided the spare column can be mapped such that the resulting bits of the data word are not "scrambled". This can be accomplished by providing a column-select cross-connect switch 83 that maps the $N_c$ of the C column bit lines to the $N_c$ output data lines shown at 86. A defective bit line is disconnected from the corresponding output line and one of the spares is mapped in its place by controller 85.

The present invention does not depend on the type of memory cell utilized to construct the array of memory cells in the memory block. Hence, the present invention can be utilized with a wide variety of memory cells including DRAM and SRAM memory cells and various types of non-volatile memory cells. In addition, the present invention can be utilized with memories based on cells that store multiple values in each cell. Examples of such memories are taught in U.S. Pat. Nos. 6,141,261 and 6,154,392, which are hereby incorporated by reference.

Various modifications to the present invention will become apparent to those skilled in the art from the foregoing description and accompanying drawings. Accordingly, the scope of the present invention is to be limited solely by the scope of the following claims.

What is claimed is:

1. A memory for storing and retrieving data values, each data value being associated with a row address, said memory comprising:

C bit lines, where C>1;

R row lines, where R>1;

an array of memory storage cells organized as R rows and C columns, there being one such column associated with each bit line and one such row associated with each row line, each memory storage cell storing a data value and having circuitry for coupling that data value to said bit line associated with said column in which said memory cell is located, said value being coupled in response to a row control signal on said row line associated with said row in which said memory cell is located;

a row select circuit for generating said row control signal on one of said row lines in response to one of said row addresses being coupled to said row select circuit, said row select circuit comprising a memory for storing a mapping of said row addresses to said row lines, said mapping determining which of said row lines is selected for each possible value of said row address; and wherein said R row lines are divided into $N_r$ normal row lines and $N_{rs}$ spare row lines, $N_r$ and $N_{rs}$ being greater than 0, and wherein said row select circuit comprises:

a first decoding circuit for generating one of said row select signals on one of said $N_r$ normal row lines in response to said row address being coupled thereto, said first decoding circuit further comprising an inhibit circuit for preventing that row select signal from being applied to that normal row line; and a second decoding circuit for storing $N_{rs}$ entries, each entry having space for storing a first value specifying one of said row addresses and a second value specifying one of said $N_{rs}$ spare row lines, said second decoding circuit determining if one of said entries includes a first value that matches said row address, said second decoding circuit causing said inhibit circuit in said first decoding circuit to prevent the application of said row select signal and said second decoding circuit generating one of said row select signals on said spare row line specified by said second value in that entry if such a match is determined.

2. The memory block of claim 1 wherein said second decoding circuit comprises a content-addressable memory.

3. The memory block of claim 1 further comprising a column select circuit for selecting a data value on one of said bit lines and applying that data value to an output line in response to a column address being coupled to said column select circuit, wherein said C bit lines are divided into $N_c$ normal bit lines and $N_{cs}$ spare bit lines, $N_c$ and $N_{cs}$ being greater than 0, and wherein said column select circuit comprises:

a column multiplexer for connecting one of said bit lines to said output line in response to a column select signal on one of the C column select lines, said column select signal determining which of said bit lines is connected to said output line, $N_c$ of said column select lines corresponding to said normal bit lines and $N_{cs}$ of said column select lines corresponding to said spare bit lines;

a third decoding circuit for generating one of said column select signals on one of said $N_c$ normal column select lines in response to said column address being coupled thereto, said third decoding circuit further comprising an inhibit circuit for preventing that column select signal from being applied to that normal column select line; and a fourth decoding circuit for storing $N_{rs}$ entries, each entry having space for storing a first value specifying one of said column addresses and a second value specifying one of said $N_{rs}$ spare bit lines, said fourth decoding circuit determining if one of said entries includes a first value that matches said column address, said fourth decoding circuit causing said inhibit circuit in said third decoding circuit to prevent the application of said column select signal and said fourth decoding circuit generating one of said column select signals on said spare column select line corresponding to said spare bit line specified by said second value in that entry if such a match is determined.

4. The memory block of claim 3 wherein said fourth decoding circuit comprises a content-addressable memory.

5. The memory of claim 1 wherein one of said second values in said second decoding circuit comprises $N_{rs}$ bits.

6. The memory of claim 1 further comprising a controller for testing said memory cells and for storing said first and second values in said second decoding circuit.

* * * * *